United States Patent [19]
Rostoker et al.

[11] Patent Number: 5,345,310
[45] Date of Patent: Sep. 6, 1994

[54] IDENTIFYING AND COMPENSATING FOR SLIP-PLANE DISLOCATIONS IN PHOTOLITHOGRAPHIC MASK ALIGNMENT

[75] Inventors: Michael D. Rostoker, San Jose; Nicholas F. Pasch, Pacifica; Joe Zelayeta, Saratoga, all of Calif.

[73] Assignee: LSI Logic Corporation, Milpitas, Calif.

[21] Appl. No.: 78,878

[22] Filed: Jun. 15, 1993

[51] Int. Cl.$^5$ .............................................. G01B 11/26
[52] U.S. Cl. ...................................... 356/401; 356/31; 250/491.1; 148/DIG. 102
[58] Field of Search ............. 437/924; 148/DIG. 102; 356/399, 400, 401, 31; 250/491.1

[56] References Cited
U.S. PATENT DOCUMENTS 4,652,134  3/1987  Pasch et al. .......................... 356/401
4,853,549  8/1989  Yanagisawa et al. ................ 356/401

FOREIGN PATENT DOCUMENTS 5067555  3/1993  Japan ..................................... 437/924

Primary Examiner—F. L. Evans
Assistant Examiner—Robert Kim
Attorney, Agent, or Firm—Gerald E. Linden

[57] ABSTRACT

Techniques for identifying and determining the orientation, magnitude, and direction of slip plane dislocations transecting semiconductor dies are described, whereby a four point alignment pattern is examined for "squareness" and size integrity. Lack of squareness or significant change in apparent size of various aspects of the alignment pattern indicate slip-plane dislocations. The magnitude, orientation and direction of the dislocations are determined geometrically from measurement of the alignment pattern. Various other aspects of the invention are directed to optimal alignment of a photolithographic mask to a die which has experienced a slip-plane dislocation, and to discrimination between slip-plane dislocation and die-site rotation.

10 Claims, 2 Drawing Sheets

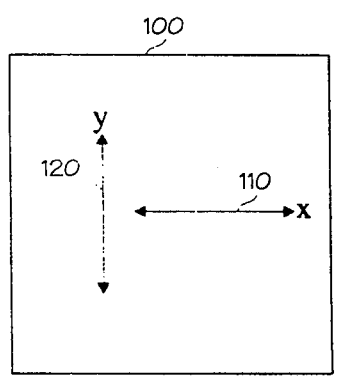
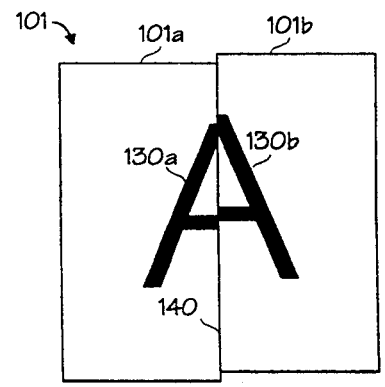
Figure 1a
Figure 1b
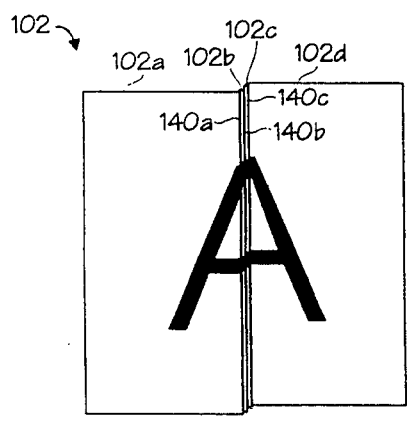
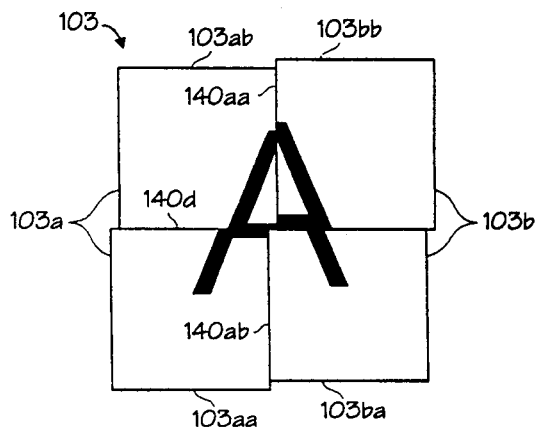
Figure 1c
Figure 1d
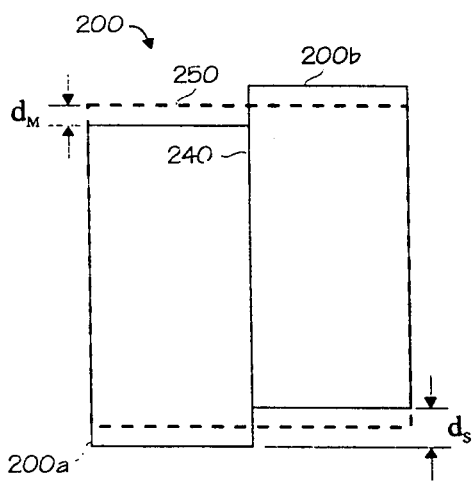
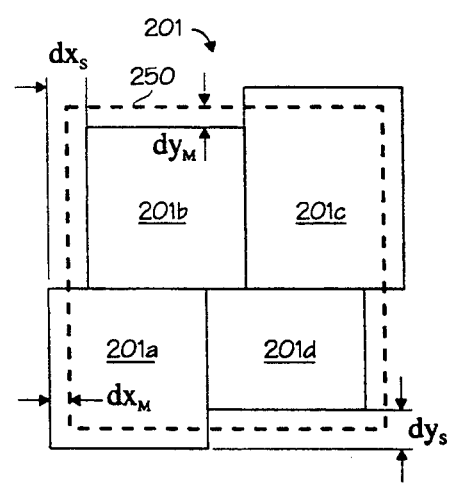
Figure 2a
Figure 2b

IDENTIFYING AND COMPENSATING FOR SLIP-PLANE DISLOCATIONS IN PHOTOLITHOGRAPHIC MASK ALIGNMENT

TECHNICAL FIELD OF THE INVENTION

The invention relates to the fabrication of integrated circuit devices, and more particularly to the alignment of lithographic masks to a semiconductor die.

BACKGROUND OF THE INVENTION

As integrated circuit devices have become smaller, the importance of even very small defects in silicon wafers has grown accordingly. It is common practice to use single crystal silicon wafers to provide a medium which is as defect-free as possible for the manufacture of integrated circuit devices. It is widely appreciated, however, that although these silicon wafers are formed as a single crystal structure, they are not without defects. Examples of such defects are: loop dislocations, s-pits, and slip plane dislocations.

Loop dislocations and s-pit defects are disruptive of the silicon crystalline lattice structure, and can have serious adverse effects on integrated circuit devices, since disruption of the lattice structure destroys the semiconductor properties of the silicon material. For example, a diode junction transected by a loop dislocation is effectively rendered non-functional. These disruptive defects are large enough and disruptive enough to have significant impact on semiconductor devices with line widths (design rules) of greater than 0.5 $\mu$m (microns, or millionths of a meter). Since 0.5 $\mu$m geometries (line widths, or design rules) are now relatively commonplace, s-pits and loop dislocations have received a great deal of attention in the semiconductor design and manufacturing community, and have been effectively dealt with. (Clearly, the effect of loop dislocations and s-pits on smaller geometries would be similar, and dealt with in the same manner.) Slip plane dislocations (also known as slip dislocations), on the other hand, do not pose significant problems for device geometries of 0.5 $\mu$m and above, and have been largely ignored in practice.

Slip dislocations ("slips") are caused by a sliding of crystal planes over one another in response to internal stresses (often process induced) within the crystalline material. These "slips" cause the planes to move anywhere from 100 Å to 2000 Å (Angstroms; an Angstrom is equal to one ten-thousandth of a micron) relative to one another (about 0.01 to 0.2 microns). A die which has experienced a slip dislocation is sometimes referred to as a "ripped" die, in analogous reference to terminology from carpentry where "ripping" refers to cutting through a board in substantial alignment with the grain of the wood.

Although slip dislocations cause physical shifts in the crystalline structure, they are not disruptive of the crystal lattice, that is, the semiconductor properties of the silicon material are unaffected by the physical shift of the crystal planes. A portion of the crystal lattice shifts during slip dislocation, but the lattice structure itself is not damaged. Therefore, a slip dislocation induced during semiconductor processing may be treated as a substantially "mechanical" (versus electrical) problem which becomes significant only when sufficient physical misalignment of a previously formed electrical structure occurs to cause it to misoperate.

For semiconductor devices fabricated to 0.5 micron (and above) line rules (geometry) slip dislocations are generally neglected since, unlike loop dislocation, there is no catastrophic lattice disruption, and the resultant mechanical misalignment of electrical devices formed to these line rules is small compared to the size of the devices. For smaller geometries, (e.g. 0.25 $\mu$m and below), the presence of slip dislocations has a significant damaging effect. The essence of the damage by slip dislocations is not to spoil the electrical characteristics of the junction, as would be seen with the above mentioned loop dislocation, but rather to create physical displacements which are sufficiently large that individual devices are no longer in sufficiently accurate registration with each other to work as a circuit. Further, it should be recognized that a small device (0.25 $\mu\mu$m design rules and below) which has been transected (e.g., bisected) by a slip dislocation (particularly larger slip dislocations, e.g., 0.1 microns or greater) may no longer function as designed, because its distorted shape may no longer adhere to the design rules for the device.

Since slip dislocations occur as a "sliding" of crystal planes over one another, the orientation of the crystal planes in a silicon wafer define and constrain the orientation of slip dislocations. The orientation of the crystal planes is determined by the orientation of the original crystal from which the wafer was derived. A typical orientation of silicon crystal for semiconductor device fabrication is the <1-0-0> crystal orientation. Silicon wafers sawn in this orientation have major crystal slip planes parallel to the X and Y axis of the wafer. Slip dislocations are expected and observed parallel to the X and Y direction of the wafer. Rectangular semiconductor dies are typically oriented on a silicon wafer such that potential slip dislocations can occur only perpendicular to the sides of the dies.

In the processing of semiconductor wafers by photolithography, it is necessary, at certain process steps, to align a photolithographic mask (or, more accurately, a projected image of the mask) with a semiconductor die site on a semiconductor wafer. The die is coated with a light-sensitive photoresist and is exposed to an image of the mask. The photoresist is then "developed" to leave behind a pattern of photoresist in the image of the mask. The wafer is then processed (i.e., by etching, diffusion, oxidation, etc.), with areas covered by the photoresist being substantially impervious to the process. It is, in part, by this method that circuit elements are formed in silicon wafers to create integrated circuit devices.

Before exposing the wafer to the image of the mask, which typically represents a single die, the image must be properly aligned with the die site to be exposed on the wafer. This is accomplished by means of one or more alignment targets formed in an earlier processing step at known locations on the wafer. The alignment targets identify the exact location of die sites on the wafer and provide a means for accurate alignment of different photolithographic masks in different processing steps. This mask alignment is usually accomplished by a mask alignment system, such as that described in commonly-owned U.S. Pat. No. 4,652,134, incorporated by reference herein. This patent describes techniques for improving alignment accuracy of mask alignment systems. Modern measurement and alignment systems are capable of measuring points on a die and aligning masks to within an accuracy of about 50 nm (nanometers, or billionths of a meter).

Often, modern mask alignment systems rely upon a plurality of alignment marks defining a die site, and use these marks to identify not only the location, but the rotational orientation of a semiconductor die site. Unfortunately, on semiconductor devices using design rules of 0.25 microns and less, slip plane dislocations can completely frustrate the operation of such alignment systems. A slip plane dislocation will cause these systems to incorrectly identify a small die rotation. The mask is then rotated to match the perceived die rotation, which causes secondary rotation-induced mask alignment errors unrelated to the slip dislocation. Worse still, the rotation does not improve the alignment of the mask to die features in the vicinity of the slip plane dislocation.

DISCLOSURE OF THE INVENTION

It is therefore an object of the present invention to provide an improved technique for aligning a photolithographic mask image to a die site.

It is another object of the present invention to provide an alignment mark configuration suited to the detection of slip dislocations on a semiconductor die site.

It is another object of the present invention to provide a method of detecting slip dislocations on a semiconductor die site.

It is another object of the present invention to provide a method for discriminating between slip plane dislocations and rotation errors.

It is another object of the present invention to provide a method for aligning a photolithographic mask to a semiconductor die site which has experienced a slip plane dislocation.

According to the invention, an alignment mark pattern for detecting slip plane dislocations on a semiconductor die is provided by forming four alignment marks, one at each of the four corners of a rectangular die site on a single crystal silicon wafer. The wafer is cut from a silicon material grown as a single crystal in a <1-0-0> crystal lattice orientation. The rectangular die site is oriented such that its sides are substantially aligned with the slip planes of the wafer's crystal lattice structure, such that slip dislocations can only occur in a direction parallel to at least one of the sides of the die site.

According to one aspect of the invention, each of the alignment marks can be located immediately outside of or immediately inside of the area (periphery) of the die site.

According to an embodiment of the invention, a method of detecting slip dislocations on die sites oriented on a silicon wafer as described above is accomplished by providing alignment marks as describe above, and measuring the distances between them. The alignment marks form a generally rectangular alignment shape. A photolithographic mask (image) is sized to correspond to the die site and has alignment reference points on the mask corresponding to the locations of the alignment marks on the wafer. A "squareness" factor is determined by taking the difference between the lengths of the diagonals of the alignment shape (which may have shifted due to a slip dislocation during processing.) If the squareness factor is greater than a pre-determined threshold value, or if the sides of the alignment shape differ from their expected values by more than a pre-determined amount, then a slip dislocation (or more than one slip dislocation) is declared. The orientation, direction and magnitude of the slip dislocation(s) can be determined geometrically/trigonometrically, as described in greater detail hereinbelow.

According to an aspect of the invention, if a slip dislocation is detected, then the orientation, magnitude, and direction of the slip dislocation are determined, and the photolithographic mask is projected at a position and orientation corresponding to a translation in the direction of the slip dislocation by a distance substantially equal to one half of the magnitude of the slip dislocation relative to the expected position of the die site. If no slip dislocation is detected, then the photolithographic mask is oriented and projected to a position and orientation where each projected alignment reference points is substantially aligned with a corresponding alignment mark for the die site.

Slip dislocations are misinterpreted as die site rotations by conventional alignment techniques. According to the invention, it is possible to distinguish between slip dislocations and die site rotations by first testing for slip dislocations according to the above described technique. If no slip dislocation is found, then misalignment of the alignment marks may be due to rotation. This may be tested for in the conventional manner.

Other objects, features and advantages of the invention will become apparent in light of the following description thereof.

BRIEF DESCRIPTION OF THE DRAWINGS

FIG. 1a is a plan view of a typical semiconductor die showing possible slip dislocation orientation.

FIG. 1b is a plan view of a semiconductor die which has experienced a single slip dislocation (rip).

FIG. 1c is a plan view of a semiconductor die which has experience multiple parallel slip dislocations.

FIG. 1d is a plan view of a semiconductor die which has experienced two slip dislocations at right angles to each other.

FIG. 2a is a diagram showing correct mask alignment for a singly "ripped" die (e.g., FIG. 1b), according to the invention.

FIG. 2b is a diagram showing correct mask alignment for a doubly "ripped" die (e.g., FIG. 1d) which has experienced orthogonal slip dislocations.

DETAILED DESCRIPTION OF THE INVENTION

Figure 3:
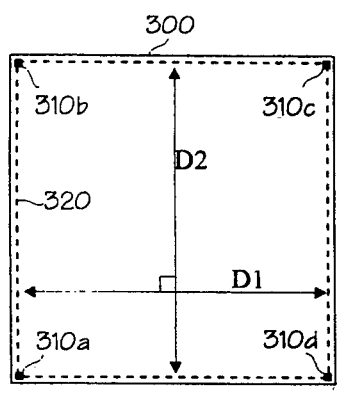
FIG. 3 is a diagram showing an alignment mark configuration suited to detecting slip plane dislocations, according to the invention.

FIGS. 1a–d illustrate the physical effect of slip dislocations on semiconductor dies and on features on the dies. The slip dislocations are depicted greatly exaggerated compared to the proportions of typical slip dislocations. (A typical slip dislocation of 0.1 micron on a 1 cm by 1 cm die represents a distortion of the shape of the die by only 0.001%.)

FIG. 1a is a plan view of a semiconductor die 100 in an exemplary orthogonal orientation on a <1-0-0> oriented wafer. In this die orientation, slip dislocation orientation will occur only in a "y" direction 120 parallel to a "vertical" axis of the die 100 (as depicted) or in an "x" direction 110 parallel to a "horizontal" axis of the die (as depicted).

FIG. 1b is a plan view of a "ripped" die 101 (e.g. 100) which has experience a single slip plane dislocation along a line 140 in the vertical direction (as depicted). The slip dislocation bisects the die 101, dividing it into two portion 101a and 101b. Features on the die (represented by a large capital letter "A") which lie across the line 140 are divided into two parts (e.g., 130a and 130b) with the parts being shifted relative to one another by the amount of the slip dislocation.

One cause of slip dislocations is process induced temperature-time stress. Diffusion regions, grown or deposited oxides, and other formations on silicon wafers have different thermal coefficients of expansion. Many die processing operations involve the application of heat, which induces mechanical stresses within the crystalline structure of the wafer as a result of differential thermal expansion. If the die is maintained at an elevated temperature for a sufficient period of time, the silicon crystal will eventually react to the stress by "slipping" in the form of a slip plane dislocation. Since these stresses often occur around areas of maximum deposition or diffusion, they tend to be localized. Sometimes a number of parallel slip dislocation will occur in a closely spaced configuration as shown and described below with respect to FIG. 1c.

FIG. 1c is a plan view of a multiply "ripped" die 102 (e.g., 100) which has experienced three separate, closely-spaced, parallel slip dislocations along lines 140a, 140b and 140c, dividing the die into four regions 102a, 102b, 102c, and 102d. If the total (cumulative) amount of slip dislocation is the same as that of the single slip dislocation shown in FIG. 1b, then the effect on features on the die (represented again as a capital letter "A") is as shown in the Figure. The net effect of this multiple slip dislocation is much the same as if a single slip having a magnitude equal to the total of the multiple slip dislocations had occurred.

FIG. 1d is a plan view of a die 103 (e.g., 100) which has experience two slip dislocations perpendicular to one another. The slip dislocations divide the die into four regions 103ab, 103bb 103aa and 103ba. The first slip dislocation occurs along a line (formed of line segments 140aa and 140ab) broken by the second slip dislocation. The first slip dislocation divides the die into two regions 103a and 103b (both rendered irregular by the second slip dislocation). The second slip dislocation occurs along a line 140d, dividing the die into two regions shown as the combinations of 103aa–103ba and 103ab–103bb. The effect of the slip dislocations on features on the die (again represented by a large capital letter "A") is as shown in the Figure.

FIGS. 1a–d illustrate the physical effect of slip dislocations on a semiconductor die. FIGS. 2a–b illustrate correct alignment of a mask to the slipped (ripped) die site.

Modern semiconductor lithography apparatus, including mask alignment features, attempt to guarantee physical stability of a semiconductor wafer and repeatability of measurements by maintaining the wafer at a temperature within about 0.02° C. of a setpoint (as close as 0.01° C. on some systems). This effectively eliminates thermal expansion as a contributor to scaling errors. Other scaling errors are completely predictable, permitting repeatability and accuracy of measurements on such systems to within about 50 nm (nanometers). For all reasonable intents and purposes, the contribution of scaling errors to mask misalignment is negligible.

FIG. 2a is a diagram showing alignment of a mask image 250 to a "ripped" die 200 (similar to 101, FIG. 1b and 102, FIG. 1c). A slip dislocation or "rip" with a magnitude of $d_S$ occurs along a line 240, dividing the die 200 into two parts 200a and 200b. The mask image 250 (which has the same dimensions as an "un-ripped" die) is aligned to the "ripped" die 200 by translating it in the direction of the slip dislocation a distance $d_M$ substantially equal to one half of the magnitude $d_S$ of the slip dislocation, as shown.

FIG. 2b is a diagram showing alignment of the same mask image 250 to another die 201 which has experienced two slip dislocations ("rips") in orthogonal directions (similar to 103, FIG. 1d). The slip dislocations divide the die into four parts 201a, 201b, 201c, and 201d. The first of the two slip dislocations is in the vertical (as depicted) direction, and has a magnitude of $dy_S$. The second slip dislocation is in the horizontal (as depicted) direction, and has a magnitude of $dx_S$. The mask image 250 is aligned to a location corresponding to approximately one half of the slip dislocation in both (x,y) directions, i.e., the mask image is translated (relative to the un-ripped die) in the vertical direction an amount $dy_M$ substantially equal to one half of $dy_S$ and in the horizontal direction an amount $dx_M$ substantially equal to one half of $dx_S$, as shown.

In general, according to the invention, if a slip dislocation which transects (e.g., bisects) a semiconductor die is small enough that any structures formed prior to the occurrence of the slip dislocation are not "ripped" to the point of effective destruction (as determined by dimensional design rules for the structures), then the overall impact of the slip dislocation can be minimized by correct compensating mask alignment.

According to the invention, correct mask alignment in response to a slip dislocation is to shift the mask (translate the mask image), without rotating it, by an amount substantially equal to one half of the magnitude of the slip dislocation displacement. This alignment gives best overall alignment of the mask to the die, as it distributes half of the slip dislocation error over the entire surface of the die without creating any unrelated alignment errors.

In order to detect slip dislocations, it is necessary to provide a number of properly placed alignment marks on the die to encompass the die and to give evidence of any slip dislocation crossing the die. "Conventional" two or three alignment mark patterns can be frustrated by a slip dislocation.

According to the invention, for rectangular dies, a suitable alignment mark pattern is one which includes at least four alignment marks, one at (or near) each corner of the die. This is described below with respect to FIG. 3.

FIG. 3 shows a suitable placement of alignment marks 310a, 310b, 310c, and 310d on a rectangular die 300. The four alignment marks 310a, 310b, 310c, and 310d form the corners of an alignment rectangle 320 (dashed lines) with a height (as depicted) of D2 and a width (as depicted) of D1. Although the alignment marks 310a, 310b, 310c, and 310d are shown in the interior of the die near the corners, they could equally well be placed exactly at the corners of the die, or just outside of the die area near the corners.

Figure 4:
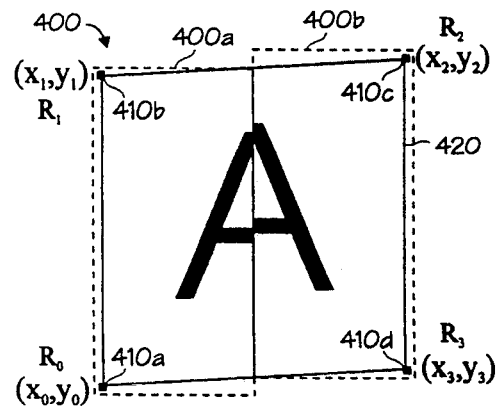
FIG. 4 is a diagram of a die site showing the effect of a slip dislocation (e.g., FIG. 1b) on the positions of alignment marks, according to the invention.

FIG. 4 shows the effect of a slip dislocation (e.g. FIG. 1b) on the alignment marks. A (formerly) rectangular die 400 (dashed lines) having four alignment marks $R_0$ 410a, $R_1$ 410b, $R_2$ 410c, and $R_3$ 401d at the four corners of the die 400 is subjected to a slip dislocation in the vertical (as depicted) direction, dividing the die into two parts 400a and 400b (shown as dashed lines). The slip dislocation displaces the alignment marks $R_2$ and $R_3$ relative to the alignment marks $R_1$ and $R_0$ such that the alignment rectangle defined by the original (pre-slip) positions of the alignment marks is distorted into a parallelogram 420 (shown as a solid line). The four alignment marks 410a, 410b, 410c, and 410d have coordinates (including the distorting effect of the slip dislocation) of $(x_0, Y_0)$, $(x_1, Y_1)$, $(x_2, Y_2)$, and $(x_3, y_3)$, respectively.

In order to calculate the correct alignment of a mask image to a "ripped" die, it is first necessary to determine the orientation, direction and magnitude (distance) of the "rip" or slip dislocation. This is described below with respect to FIGS. 5a and 5b. In order to depict the problem in its most general context, the orientation of the die and slip dislocation have been positioned so that they do not align with the x-y coordinate system used to detect them. Significant reduction of computational complexity can be realized if the coordinate system is rotated to align with at least one of the alignment "rectangle" sides (actually an alignment parallelogram after a slip dislocation, as depicted), and it is within the scope and spirit of the present invention to do so.

The computational techniques described hereinbelow represent only one of many possible suitable approaches. It is also within the spirit and scope of the present invention to use any computational technique which achieves comparable results.

Figure 5A:
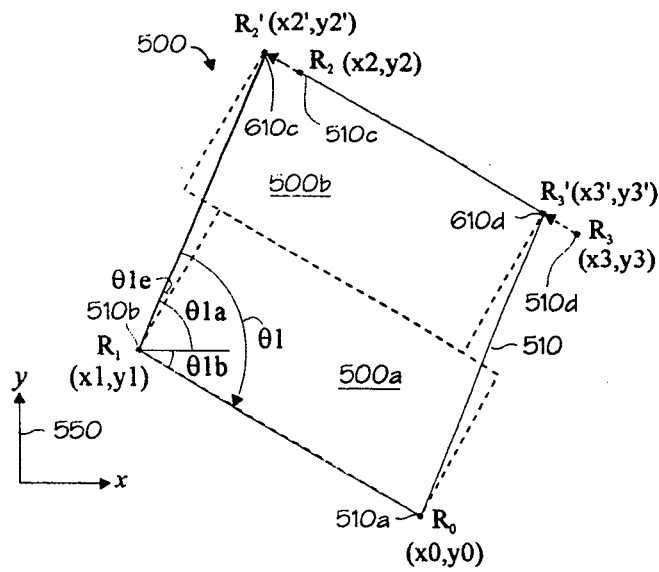
FIG. 5a is a diagram showing the geometric basis for determining the extent, direction and orientation of a slip plane dislocation, according to the invention.

FIG. 5a is a plan view of a rectangular die 500 which has experienced a slip dislocation. In an x-y coordinate system 550, alignment marks at the four corners of the die were originally at positions $R_0$ 510a, $R_1$ 510b, $R_2$ 510c, and $R_3$ 510d, prior to the slip dislocation, and had coordinates of $(x_0,y_0)$, $(x_1,y_1)$, $(x_2, y_2)$, and $(x_3,y_3)$, respectively. The slip dislocation moved the alignment marks at $R_2$ 610c and $R_3$ 610d to the positions indicated as $R_2'$ 510c' and $R_3'$ 510d', respectively, having coordinates of $(x_2',y_2')$ and $(x_3',y_3')$, respectively. The final (post-slip) positions of the four alignment marks 510a, 510b, 610c, and 610d defines a parallelogram shape 510. The distances between adjacent alignment mark points around the parallelogram are given by:

$$D_{0-1} = \sqrt{(x_1 - x_0)^2 + (y_1 - y_0)^2}$$

$$D_{1-2'} = \sqrt{(x_2' - x_1)^2 + (y_2' - y_1)^2}$$

$$D_{2-3'} = \sqrt{(x_3' - x_2)^2 + (y_3' - y_2)^2}$$

$$D_{0-3'} = \sqrt{(x_3' - x_0)^2 + (y_3' - y_0)^2}$$

and the lengths of the two diagonals of the parallelogram are given by:

$$D_{1-3'} = \sqrt{(x_3' - x_1)^2 + (y_3' - y_1)^2}$$

$$D_{0-2'} = \sqrt{(x_2' - x_0)^2 + (y_2' - y_0)^2}$$

In order to determine the orientation of the slip dislocation (which will be substantially parallel to a pair of opposite sides of the die), it is necessary to determine which pair of opposite sides of the parallelogram has changed in apparent length. The apparent lengths of the sides are given by $D_{0-1}$, $D_{1-2'}$, $D_{2'-3'}$, and $D_{0-3'}$, above. These are compared against their expected (pre-slip) length, either as calculated from design and process information, or as previously (pre-slip) measured. The sides which are (or were originally) perpendicular to the orientation of the slip dislocation will have changed in apparent length. This is readily determined by examining the values of $D_{0-1}$, $D_{1-2'}$, $D_{2'-3'}$, and $D_{0-3'}$ (determined above).

An excellent indicator of the degree of non-orthogonality "$\epsilon$" (deviation from perfect "squareness") of the parallelogram is given by the difference between the lengths of the diagonals, as follows:

$$\begin{aligned}\epsilon &= D_{1-3'} - D_{0-2'} \\ &= \sqrt{(x_3' - x_1)^2 + (y_3' - y_1)^2} - \\ &\quad \sqrt{(x_2' - x_0)^2 + (y_2' - y_0)^2}\end{aligned}$$

If $\epsilon$ is either equal to zero or very small (less than some predetermined threshold value), then there is no significant shape distortion of the die, hence no significant slip.

This "squareness" factor $\epsilon$ exhibits some "amplification" (high sensitivity) of slip dislocation due to the fact that the two contributing factors (the lengths of the diagonals of the parallelogram 510) are both relatively sensitive to slip dislocations, and change in opposite directions thereby reinforcing each other's contribution to $\epsilon$. (This is similar to a technique which has been used for centuries by carpenters to achieve squareness of a rectangular box or frame by ensuring that the diagonals are of equal length.) For a 1 cm × 1 cm square die experiencing a 0.1 μm slip dislocation, the "squareness" factor $\epsilon$ is roughly equal to 0.1414 μm, representing roughly 141% "amplification" of the magnitude of the slip dislocation.

Having determined the orientation of the slip dislocation, the sign of the "squareness" factor $\epsilon$ yields its direction (in the case shown in FIGS. 5a and 5b, sides $R_1$-$R_2'$ and $R_0$-$R_3'$ have changed in apparent length, indicating that the slip dislocation is parallel to the $R_0$-$R_1$ and $R_2'$-$R_3'$ sides). *If the exact calculations and reference point orientations described hereinabove are used (i.e., the relative positions of $R_0$, $R_1$, $R_2'$, and $R_3'$ as shown in FIG. 5a and the exact formula for $\epsilon$ given above)*, then a negative squareness factor indicates a right-to-left shift of either of the two sides of the die parallel to the slip dislocation as viewed from its opposite. Conversely, a positive squareness factor indicates a left-to-right shift of either of the sides of the die parallel to the slip dislocation as viewed from its opposite. (Any change in reference point orientation or order of calculation may reverse this directionality).

A good approximation of the magnitude of the slip dislocation may be determined according to the following formula:

$$d_{slip} \approx \epsilon \cdot \frac{d_{par}}{\sqrt{(d_{par}^2 + d_{orth}^2)}}$$

where $d_{slip}$ is the magnitude of the slip dislocation, $d_{par}$ is the length of the sides of the die parallel to the orientation of the slip dislocation, and $d_{orth}$ is the length of the sides of the die perpendicular to the orientation of the slip dislocation. A more accurate geometric/trigonometric analysis of the slip dislocation depicted in FIGS. 5a and 5b follows.

An angle $\theta 1$ formed at the corner of the parallelogram whose vertex is $R_1$ 510b, is the sum of the angles $\theta 1a$ and $\theta 1b$ formed by the sides $R_1$-$R_2'$ and $R_1$-$R_0$, respectively, with a horizontal line (y=x1) in the x-y coordinate system 550. These angles $\theta 1a$ and $\theta 1b$ are given by:

$$\theta 1a = \sin^{-1}\left(\frac{D_{1-2'}}{(x2'-x1)}\right)$$

$$= \sin^{-1}\left(\frac{\sqrt{(x2'-x1)^2 + (y2'-y1)^2}}{(x2'-x1)}\right)$$

and $$\theta 1b = \sin^{-1}\left(\frac{D_{0-1}}{(x0-x1)}\right)$$

$$= \sin^{-1}\left(\frac{\sqrt{(x1-x0)^2 + (y1-y0)^2}}{(x0-x1)}\right)$$

Once the corner angle $\theta 1$ is known, the error angle $\theta 1e$ can be computed by calculating the difference between the angle $\theta 1$ and a right angle (90°, or $\pi/2$ radians) as follows:

$$\theta 1e = \theta 1 - \frac{\pi}{2} = \theta 1a + \theta 1b - \frac{\pi}{2}$$

The magnitude of the slip dislocation is given as a function of $\theta 1e$ by:

$$d_{slip} = \frac{\sin(\theta 1e)}{D_{1-2'}}$$

$$= \frac{\sin(\text{error angle})}{d_{orth}}$$

where $d_{orth}$, as before, is the "apparent" or distorted length of one of the sides of the parallelogram which is orthogonal to the orientation of the slip dislocation. Note that for a parallelogram distortion, the error angle (deviation from 90° of the corner angles) will have the same magnitude when measured from any vertex of the parallelogram.

Figure 5B:
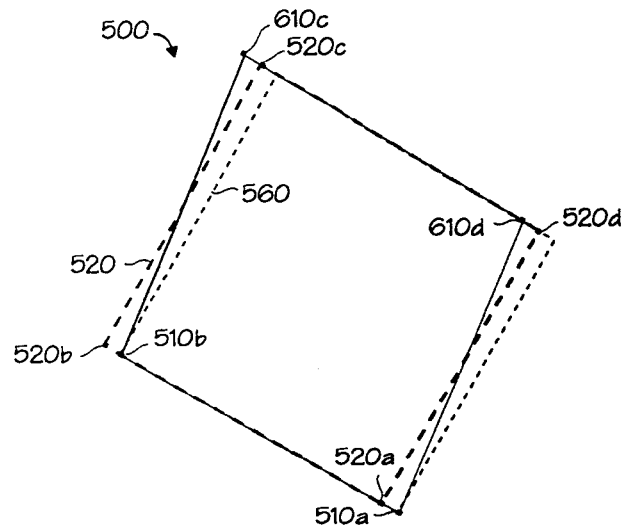
FIG. 5b is a diagram showing optimal mask alignment to compensate for the slip plane dislocation illustrated in FIG. 5a, according to the invention.

Once the magnitude, direction and orientation of the slip dislocation have been determined, the mask image is aligned to a position one half the magnitude (distance) of the slip dislocation away from the "unslipped" position of the die (as evidenced by the foregoing calculations) in the direction of the slip dislocation, as shown in FIG. 5b. In the Figure, the alignment mask image outline 520 is shown as a coarse dashed line and has alignment points 520a, 520b, 520c, and 520d, corresponding to the locations of 510a, 510b, 510c, and 510d (FIG. 5a). The position of the die outline 560 prior to the slip dislocation is shown as a fine dashed line. The mask image outline is positioned away from the "unripped" die outline 560 a distance substantially equal to one half of the magnitude of the slip dislocation in the direction of the slip dislocation, without rotation. The actual x and y displacements $\Delta x_m$ and $\Delta y_m$ of the mask alignment points are given by:

$$\Delta x_m = \frac{d_{slip}(x1-x0)}{D_{0-1}} = d_{slip}\cos(\theta 1b)$$

and $$\Delta y_m = \frac{d_{slip}(y1-y0)}{D_{0-1}} = d_{slip}\sin(\theta 1b)$$

For the example of FIG. 5a, then, the position (mx0, my0) of the mask alignment point corresponding to $R_0$ 510a is given by:

$$(mx0, my0) = (x0 + \Delta x_m, y0 + \Delta y_m)$$

Similarly, the position (mx1, my1) of the mask alignment point corresponding to $R_1$ 510b is given by:

$$(mx1, my1) = (x1 + \Delta x_m, y1 + \Delta y_m)$$

These two alignment point locations predispose (predetermine) the position of the remaining mask alignment points.

It will readily be appreciated by one of ordinary skill in the art that a pair of orthogonal slip dislocations will yield distortions in the apparent lengths of all four sides of the die (as measured between the alignment markings). In a few obscure cases, it is possible for multiple slip dislocations to restore squareness (e.g., a square die which undergoes a pair of equal magnitude orthogonal slip dislocations where the second slip occurs at +90° relative to the first). This, of course, tends to limit the effectiveness of the "squareness" factor $\epsilon$, but in these cases, all four sides of the die will have apparent lengths (as measured between the alignment markings) which are longer than their original lengths.

According to the invention, the squareness factor is used in combination with examination of the distances between the alignment markings, and any combination of slips can be detected. The orientations, directions and magnitudes of the slips can readily be determined by geometric techniques well known to those of ordinary skill in the art.

If the squareness factor is very small or zero, and the sides of the rectangle defined by the alignment marks are all substantially equal in length to their expected lengths, then slip dislocations are eliminated as a possibility. At this point rotational errors can be processed (compensated for) in conventional fashion.

A method for discriminating between slip dislocations and rotation errors comprises the steps of:

1) testing for slip dislocation as described hereinabove.

2) if slip dislocations are eliminated
then 3) test for rotation errors, 4) if a rotation error is not found
then 5) END
else 6) declare a rotation error and END else 7) declare a slip dislocation and END It will readily be appreciated by one of ordinary skill in the art that the effect of multiple, (e.g. closely spaced) parallel slip dislocations is the same (for the purposes of mask alignment) as a single slip dislocation with a magnitude equal to the cumulative effect (sum of the magnitudes) of the parallel slip dislocations. It is not necessary (and not possible with only four alignment marks) to distinguish a single slip dislocation from equivalent multiple parallel slip dislocations.

It will readily be apparent to one of ordinary skill in the art that subsequent slip dislocations between processing steps may further distort the alignment mark positions. Hence, the mask image alignment must be re-calculated, according to the invention, for each photolithographic process step.

If a single slip dislocation (or the cumulative effect of multiple slip dislocations) is greater than a predetermined amount (related to the design rules or geometry) then the die may be assumed to be ruined. At this point, further processing of the die is futile, and it may be skipped. As an example, a maximum slip displacement threshold of 0.1 microns might be set for a 0.25 micron design rule device. Under these conditions, if a single slip dislocation (or accumulation of slip dislocations) detected across a die is greater than 0.1 microns, then the die may be assumed to be ruined.

Although the alignment marks have been described as being placed at the four corners of a die site, one of ordinary skill in the art to which the present invention most nearly pertains will recognize that the alignment marks could be placed at known positions along the sides of the die site. Hence, in the claims that follow, "corners" can be read as "known position along a side". Either "arrangement" can be used to determine if a slip has occurred (and allow for appropriate correction thereof). Placing the alignment marks at the corners, however, is preferred, since this location will provide the ability to determine the extend of the die site simply by connecting the four alignment marks with lines.

What is claimed is:

1. A mask alignment marking arrangement for detecting slip plane dislocation on a rectangular die, comprising:
   a predetermined <1-0-0> crystal lattice orientation of a single-crystal silicon wafer;
   a rectangular die site defined on the wafer, said rectangular die site having four corners and four sides defining an enclosed rectangular die area and oriented such that the sides of the die site are substantially aligned with slip planes of the <1-0-0> crystal lattice orientation; and
   a plurality of mask alignment marks disposed on the wafer, four of the alignment marks disposed in close proximity to a respective one of the four corners of the die site.

2. A mask alignment marking arrangement according to claim 1, wherein:
   each of the four alignment marks is located immediately outside of the area of the die site.

3. A mask alignment marking arrangement according to claim 1, wherein:
   each of the four alignment marks is located immediately inside of the area of the die site.

4. A method of detecting slip dislocations on a rectangular semiconductor die, comprising:
   providing a silicon wafer with <1-0-0> crystal lattice orientation;
   defining on the wafer a rectangular die site, said die site having four sides and four corners defining an enclosed rectangular die area and oriented such that the sides of the die site are substantially aligned with the <1-0-0> crystal lattice orientation of the wafer;
   disposing on the wafer a plurality of alignment marks, four of the alignment marks disposed in close proximity to a respective one of the four corners of the die area, said alignment markings defining corners of a four-sided alignment shape;
   measuring the distances between the alignment marks for the die site;
   determining a squareness factor for the die site by computing a difference between measured distances corresponding to diagonals of the four-sided alignment shape; and
   performing, if the squareness factor is greater than a pre-defined threshold value or if the measured distances between alignment marks corresponding to sides of the alignment shape differ from expected values therefor by greater than a pre-defined tolerance, the step of indicating one or more slip-plane dislocations as having occurred since disposing the alignment marks.

5. A method according to claim 4, wherein:
   each of the alignment marks is located immediately outside of the area of the die site.

6. A method according to claim 4, wherein:
   each of the alignment marks is located immediately inside of the area of the die site.

7. A method according to claim 4, further comprising:
   providing a photolithographic mask sized to correspond to the area of the die site and having alignment reference points on the mask corresponding to the locations of the alignment marks on the wafer;
   providing means for orienting, scaling, and projecting an image of the mask anywhere over an area of the wafer which includes the die site;
   performing, if the squareness factor is greater than a pre-defined threshold value or if the measured distances between alignment marks corresponding to sides of the alignment shape differ from expected values therefor by greater than a pre-defined tolerance, the steps of:
   determining the orientation, direction and magnitude of the one or more slip-plane dislocations; and
   orienting and projecting the mask image to a position corresponding to a shift of the mask image in the direction of the slip dislocation an amount substantially equal to one half of the magnitude of the slip dislocation relative to an expected position of the die site;
   otherwise performing the step of:
   orienting and projecting the mask image to a position corresponding whereat each projected alignment reference points is substantially aligned with a corresponding alignment mark for the die site.

8. A method according to claim 7, wherein:
   each of the alignment marks is located immediately outside of the area of the die site.

9. A method according to claim 7, wherein:

each of the alignment marks is located immediately inside of the area of the die site.

10. A method of discriminating between slip dislocation and rotation of a die site, comprising:

providing a silicon wafer with <1-0-0> crystal lattice orientation;

defining on the wafer a rectangular die site, said die site having four sides and four corners defining an enclosed rectangular die area and oriented such that the sides of the die site are substantially aligned with the <1-0-0> crystal lattice orientation of the wafer;

disposing on the wafer a plurality of alignment marks, four of the alignment marks disposed in close proximity to a respective one of the four corners of the die area, said alignment markings defining corners of a four-sided alignment shape;

testing for a slip dislocation;

if a slip dislocation is found, indicating a slip dislocation error;

if no slip dislocation is found, testing for a rotation of the die site; and if a rotation error is found, indicating a rotation error.

* * * * *